(12) United States Patent
Song

(10) Patent No.: US 7,626,672 B2
(45) Date of Patent: Dec. 1, 2009

(54) PORTABLE DISPLAY DEVICE

(75) Inventor: Hyo Shin Song, Ulsan (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 264 days.

(21) Appl. No.: 11/520,205

(22) Filed: Sep. 12, 2006

(65) Prior Publication Data

US 2007/0115419 A1    May 24, 2007

(30) Foreign Application Priority Data

Nov. 23, 2005 (KR) .................. 10-2005-0112568

(51) Int. Cl.
*G02F 1/1345* (2006.01)
(52) U.S. Cl. ........................ 349/150; 439/92
(58) Field of Classification Search .................. 349/56, 349/58, 84, 139, 149, 152
See application file for complete search history.

(56) References Cited

U.S. PATENT DOCUMENTS

| | | | | |
|---|---|---|---|---|
| 3,611,275 | A | * | 10/1971 | Leddy et al. ................ 439/856 |
| 3,842,189 | A | * | 10/1974 | Southgate .................... 174/547 |
| 3,868,676 | A | * | 2/1975 | Hennessey et al. ............ 345/43 |
| 4,295,700 | A | * | 10/1981 | Sado ............................ 439/91 |
| 4,751,199 | A | * | 6/1988 | Phy .............................. 29/827 |
| 4,762,966 | A | * | 8/1988 | Kosanda .................... 174/369 |
| 4,793,814 | A | * | 12/1988 | Zifcak et al. ................. 439/66 |
| 4,842,529 | A | * | 6/1989 | Frantz et al. ................. 439/95 |
| 5,262,925 | A | * | 11/1993 | Matta et al. ................ 361/783 |
| 5,294,039 | A | * | 3/1994 | Pai et al. ................ 228/180.22 |
| 5,294,994 | A | * | 3/1994 | Robinson et al. ............ 348/825 |
| 5,309,324 | A | * | 5/1994 | Herandez et al. ............ 361/734 |
| 5,319,523 | A | * | 6/1994 | Ganthier et al. ............. 361/753 |
| 5,348,484 | A | * | 9/1994 | Sorrentino .................. 439/101 |
| 5,476,211 | A | * | 12/1995 | Khandros ................ 228/180.5 |
| 5,518,964 | A | * | 5/1996 | DiStefano et al. ........... 438/113 |
| 5,586,893 | A | * | 12/1996 | Mosquera .................... 439/108 |
| 5,603,620 | A | * | 2/1997 | Hinze et al. ................... 439/95 |

(Continued)

FOREIGN PATENT DOCUMENTS

JP          05201184 A  *  8/1993

(Continued)

OTHER PUBLICATIONS

Patent Abstract of Japan for Japanese Publication No. 05-273572, published Oct. 22, 1993 in the name of Yoichiro Sakaki, et al.

(Continued)

*Primary Examiner*—Frank G Font
*Assistant Examiner*—Peter Radkowski
(74) *Attorney, Agent, or Firm*—Christie, Parker & Hale, LLP

(57) ABSTRACT

A portable display panel includes a liquid crystal display panel for displaying images, a backlight assembly including a light source for supplying light to the liquid crystal display panel, a bottom chassis for receiving the backlight assembly, a first printed circuit board for controlling the liquid crystal display panel and the light source, a second printed circuit board connected to the first printed circuit board and an external drive circuit, and a protrusion extending from the first printed circuit board. The protrusion has copper film exposed on its end. The copper film of the protrusion is electrically connected to the bottom chassis.

20 Claims, 3 Drawing Sheets

U.S. PATENT DOCUMENTS

| | | | | |
|---|---|---|---|---|
| 5,647,748 A * | 7/1997 | Mills et al. | | 439/81 |
| 5,774,199 A * | 6/1998 | Ozawa | | 349/149 |
| 5,838,400 A * | 11/1998 | Ueda et al. | | 349/58 |
| 5,838,412 A * | 11/1998 | Ueda et al. | | 349/150 |
| 5,865,631 A * | 2/1999 | Berto et al. | | 439/59 |
| 5,920,460 A * | 7/1999 | Oldendorf et al. | | 361/753 |
| 6,025,992 A * | 2/2000 | Dodge et al. | | 361/704 |
| 6,054,975 A * | 4/2000 | Kurokawa et al. | | 345/100 |
| 6,122,704 A * | 9/2000 | Hass et al. | | 711/100 |
| 6,191,838 B1 * | 2/2001 | Muramatsu | | 349/149 |
| 6,195,148 B1 * | 2/2001 | Sasuga et al. | | 349/149 |
| 6,198,362 B1 * | 3/2001 | Harada et al. | | 333/12 |
| 6,262,696 B1 * | 7/2001 | Seraphim et al. | | 345/1.3 |
| 6,336,269 B1 * | 1/2002 | Eldridge et al. | | 29/885 |
| 6,358,065 B1 * | 3/2002 | Terao et al. | | 439/67 |
| 6,403,879 B1 * | 6/2002 | Clements et al. | | 174/358 |
| 6,411,353 B1 * | 6/2002 | Yarita et al. | | 349/59 |
| 6,411,359 B1 * | 6/2002 | Kobayashi et al. | | 349/149 |
| 6,424,538 B1 * | 7/2002 | Paquin | | 361/752 |
| 6,525,266 B2 * | 2/2003 | Ferland et al. | | 174/371 |
| 6,592,399 B2 * | 7/2003 | Robinson et al. | | 439/517 |
| 6,624,432 B1 * | 9/2003 | Gabower et al. | | 250/515.1 |
| 6,669,489 B1 * | 12/2003 | Dozier et al. | | 439/71 |
| 6,675,470 B2 * | 1/2004 | Muramatsu | | 29/832 |
| 6,692,271 B2 * | 2/2004 | Watanabe | | 439/108 |
| 6,727,579 B1 * | 4/2004 | Eldridge et al. | | 257/692 |
| 6,778,406 B2 * | 8/2004 | Eldridge et al. | | 361/776 |
| 6,822,532 B2 * | 11/2004 | Kane et al. | | 333/116 |
| 6,835,898 B2 * | 12/2004 | Eldridge et al. | | 174/267 |
| 6,930,737 B2 * | 8/2005 | Weindorf et al. | | 349/96 |
| 7,164,586 B2 * | 1/2007 | Lin | | 361/714 |
| 7,225,538 B2 * | 6/2007 | Eldridge et al. | | 29/879 |
| 7,270,274 B2 * | 9/2007 | Hennick et al. | | 235/462.43 |
| 7,292,290 B2 * | 11/2007 | Miyagawa et al. | | 349/58 |
| 2002/0090862 A1 * | 7/2002 | Berstein et al. | | 439/701 |
| 2002/0130985 A1 * | 9/2002 | Weindorf et al. | | 349/61 |
| 2002/0181212 A1 * | 12/2002 | Paquin et al. | | 361/752 |
| 2004/0169782 A1 * | 9/2004 | Lai et al. | | 349/58 |
| 2004/0218369 A1 * | 11/2004 | Dean | | 361/757 |
| 2004/0231879 A1 * | 11/2004 | Ebihara | | 174/52.4 |
| 2005/0024573 A1 * | 2/2005 | Suzuki | | 349/149 |
| 2005/0052857 A1 * | 3/2005 | Regimbal et al. | | 361/796 |
| 2005/0059281 A1 * | 3/2005 | Bricaud et al. | | 439/188 |
| 2005/0124221 A1 * | 6/2005 | Lin | | 439/620 |
| 2005/0286008 A1 * | 12/2005 | Miyagawa et al. | | 349/158 |
| 2006/0087600 A1 * | 4/2006 | Lao | | 349/58 |
| 2006/0120543 A1 * | 6/2006 | Kobayashi et al. | | 381/152 |

FOREIGN PATENT DOCUMENTS

| | | | |
|---|---|---|---|
| JP | 5-273572 | | 10/1993 |
| JP | 2001-188246 | | 7/2001 |
| JP | 2005209868 A | * | 8/2005 |
| KR | 2003-0031336 | | 4/2003 |
| KR | 10-2005-0039021 | | 4/2005 |
| KR | 10-2005-0064886 | | 6/2005 |

OTHER PUBLICATIONS

Korean Patent Abstract for Korean Publication No. 1020030031336 A, published Apr. 21, 2003 in the name of Seung Yeop Lee.

* cited by examiner

PORTABLE DISPLAY DEVICE

CROSS-REFERENCE TO RELATED APPLICATION

This application claims priority to and the benefit of Korean Patent Application Nos. 10-2005-112568, filed on Nov. 23, 2005, in the Korean Intellectual Property Office, the entire content of which is incorporated herein by reference.

BACKGROUND

Liquid crystal displays and organic light emitting displays have been gaining popularity as alternatives to conventional CRTs due to their advantages of small size, light weight, and low power consumption. Currently, these displays are typically mounted in large-sized products, such as monitors and TVs, as well as portable devices, such as mobile phones and personal digital assistants.

FIG. 1 is an exploded perspective view illustrating a conventional portable display device. FIG. 1 shows a dual display device used in mobile phones and the like.

Referring to FIG. 1, the conventional portable display device 60 includes a top chassis 2, a liquid crystal display panel 4, a backlight assembly 50, a bottom chassis 22, a first printed circuit board 24, a second printed circuit board 26, and a light emitting display panel 30.

The liquid crystal display panel 4 displays predetermined images. To display images, the first liquid crystal display panel 4 includes a first substrate 4a, a second substrate 4b, and a liquid crystal layer (not shown) injected between the first substrate 4a and the second substrate 4b.

The second substrate 4b includes a plurality of thin film transistors (TFTs) arranged in a matrix form (not shown). A source electrode of each TFT is connected to a data line (not shown), and a gate electrode thereof is connected to a scan line (not shown). A drain electrode of each TFT is connected to a pixel electrode (not shown) made of transparent indium tin oxide (ITO) of a conductive material. The TFTs are turned on when the scan line is supplied with a scan signal, and supply a data signal from the data line to the pixel electrode.

An integrated circuit 6 is located on one side of the second substrate 4b, and the data signal and scan signal are supplied from the integrated circuit 6. A protective layer 8 is deposited around the integrated circuit 6.

The first substrate 4a is arranged facing the second substrate 4b. A common electrode made of ITO is deposited on the front surface of the first substrate 4a. The common electrode is applied with a predetermined voltage, and accordingly a predetermined electric field is generated between the common electrode and the pixel electrode. The array angle of the liquid crystal injected between the first substrate 4a and the second substrate 4b varies with the electric field, and the optical transparency also varies according to the variation of the array angle, to thereby display desired images.

The backlight assembly 50 includes a mold frame 16, light emitting diodes (LEDs) 12, an LED substrate 14, a light guide plate 18, a reflective plate 20 and optical sheets 10.

The LEDs 12 emit a predetermined brightness of light corresponding to a drive signal from the LED substrate 14.

The light guide plate 18 supplies the light from the LEDs 12 to the liquid crystal display panel 4. That is, the light guide plate 18 supplies the light from its side surface to the liquid crystal display panel 4 located on its upper side.

The reflective plate 20, which is arranged in the back surface of the light guide plate 18, re-supplies the incidence light from the light guide plate 18 back toward the light guide plate 18. That is, the reflective plate 20 improves the optical efficiency by re-supplying its incident light to the light guide plate 18.

The optical sheets 10 enhance the brightness of light from the light guide plate 18 to supply the enhanced light to the liquid crystal display panel 4.

The LED substrate 14, which is connected to the first printed circuit board 24, supplies the drive signal to the LEDs 12 corresponding to control signal from the first printed circuit board.

The LED substrate 14 mounted with LEDs 12 is received and fixed, and the liquid crystal display panel 4 and backlight assembly 50 are fixed and supported, in the mold frame 16. The top chassis 2 is fixed to the upper side of the mold frame 16, and the bottom chassis 22 is fixed to the lower side of the mold frame 16. An opening is formed in the part of the bottom chassis 22 such that a light emitting display panel 30 can be inserted.

The second printed circuit board 26 is supplied with the drive signal from a drive circuit (not shown) located in the mobile phone. For this, the second printed circuit board 26 includes a mobile phone connector 28. The mobile phone connector 28 is connected to another connector attached to the drive circuit located in the mobile phone, to thus be supplied with the drive signal from the drive circuit located in the mobile phone. The second printed circuit board 26 supplied with the drive signal generates various control signals corresponding to the drive signal.

The first printed circuit board 24 is connected to the second printed circuit board 26 through a first pad unit 38 provided in the second printed circuit board 26. The first printed circuit board 24 is connected to the integrated circuit 6 of the first liquid crystal display panel 4 and LED substrate 14 by a flexible printed circuit board (not shown). The first printed circuit board 24 connected to the integrated circuit 6 and LED substrate 14 drives the integrated circuit 6 and LED substrate 14 corresponding to the control signals supplied from the second printed circuit board 26.

The light emitting display panel 30 includes a first substrate 30a and a second substrate 30b. The second substrate 30a is arranged with organic LEDs (not shown) in a matrix form. The organic LEDs generate a predetermined brightness of light corresponding to the amount of current supplied to it. The light emitting display panel 30 is connected to the second printed circuit board 26 by the second pad unit 36 of the flexible printed circuit board 32. The flexible printed circuit board 32 is mounted with an integrated circuit 34, which causes predetermined images to be displayed on the light emitting display panel 30 corresponding to the control signals from the second printed circuit board 26.

The first and second printed circuit boards 24, 26 are earthed, i.e. grounded, to the bottom chassis 22 formed of a metal material, and are thus driven stably. For this, a region on both side ends of the second printed circuit board 26 exposes its copper film to the outside, and conductive tapes 40a, 40b are attached to the copper film.

The conductive tapes 40a, 40b are connected to the bottom chassis 22 when the portable display device 60 is assembled, thus allowing the ground of the first and second printed circuit boards 24, 26 to be earthed to the bottom chassis 22. However, if the first and second printed circuit boards 24, 26 are connected to the bottom chassis 22 using the conductive tapes 40a, 40b, conductive resistance rises due to the resistance of the conductive tapes 40a, 40b. Accordingly, there exists a problem that Electrostatic Discharge (ESD) is reduced. In addition, there exists a problem that the addition of conductive tapes 40a, 40b for earthing of the first and second printed circuit boards 24, 26 raises manufacturing cost, and also increases process time.

SUMMARY OF THE INVENTION

Accordingly, an aspect of the present invention is to provide a portable display device including a liquid crystal display panel for displaying images, a backlight assembly including a light source for supplying light to the liquid crystal display panel, a bottom chassis for receiving the backlight assembly, a first printed circuit board for controlling the liquid crystal display panel and the light source, a second printed circuit board connected to the first printed circuit board and an external drive circuit, and a protrusion extending from the first printed circuit board. The protrusion has copper film exposed on an end thereof, and the copper film of the protrusion is electrically connected to the bottom chassis.

In one embodiment, the copper film of the protrusion is connected to a ground of the first printed circuit board and a ground of the second printed circuit board. A second protrusion may also be included, and the first and second protrusions extend from opposite sides of the first printed circuit board. The protrusion is folded, such as at a predetermined angle.

In another embodiment, a light emitting panel is connected to the second printed circuit board. The light emitting panel may be connected to the second printed circuit board on a side distal to the first printed circuit board.

In one embodiment, the liquid crystal display panel includes a first substrate, a second substrate facing the first substrate, the second substrate having a plurality of thin film transistors located thereon, and a liquid crystal layer injected between the first substrate and the second substrate.

In another embodiment, the light source includes at least one light emitting diode.

BRIEF DESCRIPTION OF THE DRAWINGS

These and/or other aspects and features of the invention will become apparent and more readily appreciated from the following description of examples of embodiments, taken in conjunction with the accompanying drawings of which.

DETAILED DESCRIPTION

Hereinafter, examples of embodiments will be described in more detail with reference to the accompanying FIGS. 2 and 3, so that the present invention can be easily made by a person having ordinary skill in the art to which the invention pertains.

Figure 1:
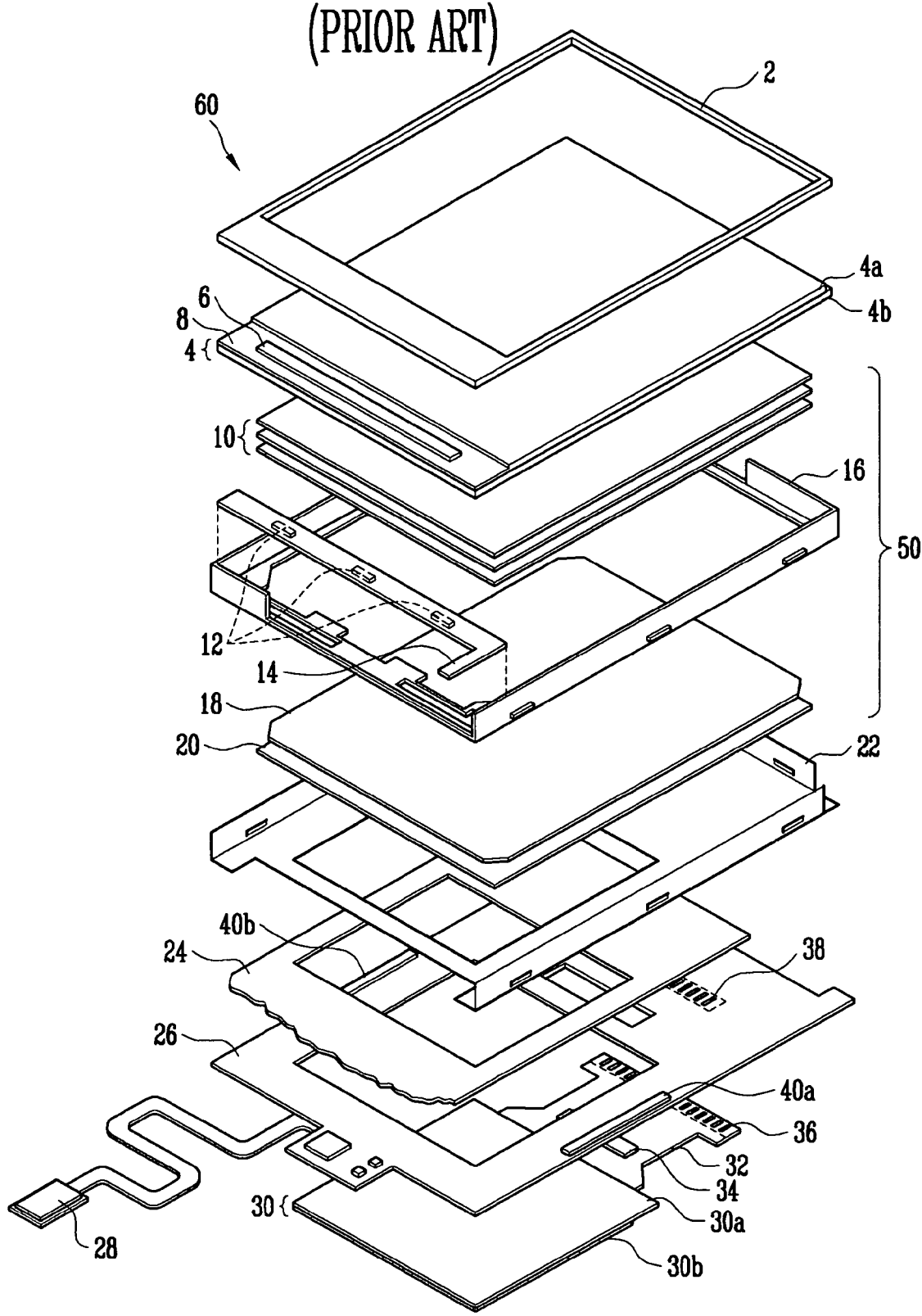
FIG. 1 is an exploded perspective view illustrating a conventional portable display device.
Figure 2:
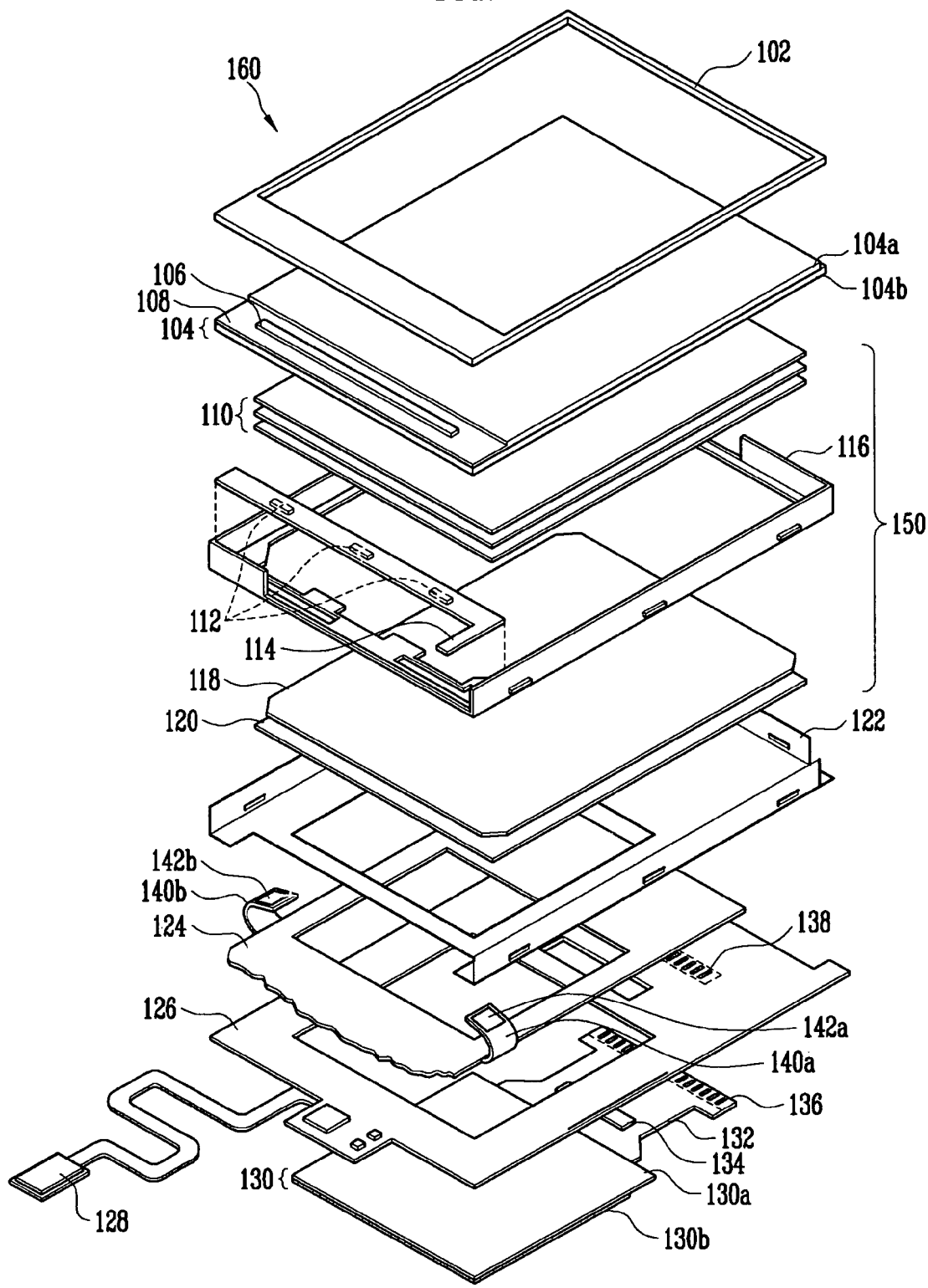
FIG. 2 is an exploded perspective view illustrating a portable display device according to an embodiment of the present invention.
Figure 3:
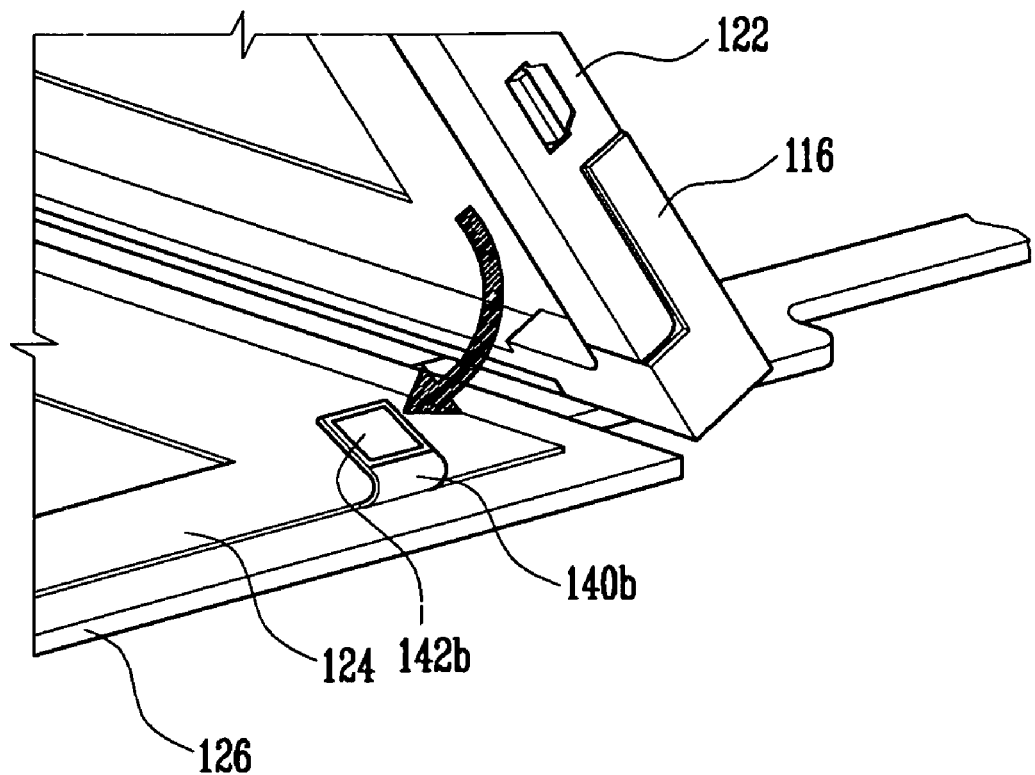
FIG. 3 is a detailed view of a protrusion and a bottom chassis of the embodiment shown in FIG. 2.

FIG. 2 is an exploded perspective view for illustrating a portable display device according to an embodiment of the present invention. Although a dual display device used in mobile phones is shown in FIG. 2, this is only an example to illustrate the construction and arrangement of a liquid crystal display device according to the present invention, and the present invention is not limited thereto. Accordingly, the construction and arrangement of the portable display device can be altered in various ways.

Referring to FIG. 2, a portable display device 160 of one embodiment of the present invention includes a top chassis 102, a liquid crystal display panel 104, a backlight assembly 150, a bottom chassis 122, a first printed circuit board 124, a second printed circuit board 126, and a light emitting display panel 130. The light emitting display panel 130 can also be replaced with other types of display panels, such as an LCD display panel.

The liquid crystal display panel 104 has a wide screen so that more information can be displayed than that of the light emitting display panel 130. For example, the liquid crystal display panel 104 may face the inside of a folder type mobile phone, and the light emitting display panel 130 may face the outside of the folder type mobile phone. The light emitting display panel 130 displays a relatively small amount of information such as time information, whereas the liquid crystal display panel 104 displays a relatively large amount of information, such as call information.

The liquid crystal display panel 104 includes an integrated circuit 106, a first substrate 104a, a second substrate 104b, and a liquid crystal layer (not shown) injected between the first substrate 104a and the second substrate 104b.

The second substrate 104b includes a plurality of TFTs (not shown) arranged in a matrix form. A source electrode of each TFT is connected to a data line (not shown), and a gate electrode thereof is connected to a scan line (not shown). A drain electrode of each TFT is connected to a pixel electrode (not shown) made of transparent ITO of a conductive material. The TFTs are turned on when the scan line is supplied with a scan signal and supply a data signal from the data line to the pixel electrode.

The integrated circuit 106 supplies the scan signal and data signal to the TFT. A protective layer 108 is deposited around the integrated circuit 106.

The first substrate 104a is arranged facing the second substrate 104b. A common electrode made of ITO is located on the front surface of the first substrate 104a. The common electrode is applied with a predetermined voltage, and thus a predetermined electric field is generated between the common electrode and the pixel electrode. The array angle of the liquid crystal injected between the first substrate 104a and the second substrate 104b varies with the electric field, and the optical transparency also varies according to the variation of the array angle to thereby display desired images.

The backlight assembly 150 includes a mold frame 116, LEDs 112, an LED substrate 114, a light guide plate 118, a reflective plate 120 and optical sheets 110. The LEDs 112 emit a predetermined brightness of light corresponding to a drive signal from the LED substrate 114. Although LEDs 112 are used as a light source for convenience of description, other light sources such as a lamp can also be used as the light source. In addition, the number of LEDs 112 can vary, and can be at least one or more LEDs.

The light guide plate 118 supplies the light from the LEDs 112 to the liquid crystal display panel 104. That is, the light guide plate 118 supplies the light to be supplied from its side surface, to its upper side.

The reflective plate 120 re-supplies the light to be supplied from the light guide plate 118, back toward the light guide plate 118. That is, the reflective plate 120 improves the optical efficiency by re-supplying the incident light back toward the light guide plate 118.

The optical sheets 110 enhance the uniformity and brightness of light from the light guide plate 118 to supply the enhanced light to the liquid crystal display panel 104.

The LED substrate 114, which is connected to the first printed circuit board 124, supplies the drive signal to the LEDs 112 corresponding to control signals from the first printed circuit board 124.

The LED substrate 114 mounted with LEDs 112 is received and fixed, and the liquid crystal display panel 104 and backlight assembly 150 are fixed and supported, in the mold frame 116. The top chassis 102 is fixed to the upper side of the mold frame 116, and the bottom chassis 122 is fixed to the lower side of the mold frame 116. An opening is formed in a part of the bottom chassis 122 such that a light emitting display panel can be inserted.

The second printed circuit board 126 is supplied with the drive signal from a drive circuit (not shown) located in the mobile phone (not shown). For this, the second printed circuit board 126 includes a mobile phone connector 128. The mobile phone connector 128 is connected to another connector attached to the drive circuit located in the mobile phone, to thus be supplied with the drive signal from the drive circuit located in the mobile phone. The second printed circuit board 126, supplied with the drive signal, generates various control signals corresponding to the drive signal supplied to it.

The first printed circuit board 124 is connected to the second printed circuit board 126 through a first pad unit 138 provided in the second printed circuit board 126. The first printed circuit board 124 is connected to the integrated circuit of the first liquid crystal display panel 104 and LED substrate 114 by a flexible printed circuit board (not shown). The first printed circuit board 124 connected to the integrated circuit 106 and LED substrate 114 drives the integrated circuit 106 and LED substrate 114 corresponding to the control signals supplied from the second printed circuit board 126.

The light emitting display panel 130 includes a first substrate 130a and a second substrate 130b. Pixels including organic light emitting diodes (not shown) are arranged on the second substrate 130b in a matrix form. The light emitting display panel 130 is connected to the flexible printed circuit board 132, which is in turn connected to the second printed circuit board 126 through the second pad unit 136. The flexible printed circuit board 132 is mounted with an integrated circuit 134, which displays predetermined images on the light emitting display panel 130 corresponding to the control signals from the second printed circuit board 126.

Protrusions 140a, 140b extend from both sides of the first printed circuit board 124 and have a protective film covering copper films. The protective film at the end of the protrusions is removed so that the copper films 142a, 142b are exposed. The copper films 142a, 142b exposed at the end of the protrusions 140a, 140b are connected to the ground of the first printed circuit board 124 and the second printed circuit board 126. The copper films 142a, 142b of the protrusions 140a, 140b are also connected to the bottom chassis 122 when the liquid crystal display device is assembled. In other words, the copper films 142a, 142b are connected to the bottom chassis 122 made of a metal material when the portable display device is assembled, and thus the ground of the first printed circuit board 124 and the second printed circuit board 126 are connected to the bottom chassis 122, thus making it possible to secure stable driving.

The protrusions 140a, 140b of the present invention produce a predetermined restoring force, by which the protrusions can be stably connected to the bottom chassis 122. As shown in FIG. 3, the protrusions are folded (approximately 180 degrees when the portable display device is assembled) and are connected to the bottom chassis. The first printed circuit board 124 of the present invention is formed of Flexible Printed circuit board (FPCB), and thus the protrusions 140a, 140b can be bent at various angles.

Although the present invention illustrates two protrusions 140a, 140b for convenience of description, one or more protrusions may be included in the present invention.

As described above, the present invention can reduce conductance resistance compared to the prior art by connecting the ground copper films 142a, 142b of the first and second printed circuit boards 124, 126 directly to the bottom chassis 122 without being connected through another material. In practice, the present invention can reduce conductive resistance by approximately 2Ω or more compared to the prior art, and thus can improve ESD. The present invention can shorten the manufacturing cost and process time since it does not use conductive tapes like the prior art.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A portable display panel comprising:
   a liquid crystal display panel for displaying images;
   a backlight assembly including a light source for supplying light to the liquid crystal display panel;
   a bottom chassis for receiving the backlight assembly;
   a first printed circuit board for controlling the liquid crystal display panel and the light source, the first printed circuit board including a ground copper film; and
   a second printed circuit board connected to the first printed circuit board and an external drive circuit,
   wherein the first printed circuit board has an integral protrusion extending from a first side at a periphery of the first printed circuit board, the ground copper film exposed at an end of the protrusion, wherein the exposed ground copper film at the end of the protrusion is electrically connected to the bottom chassis.

2. The portable display panel as claimed in claim 1, wherein the ground copper film is connected to a ground of the second printed circuit board.

3. The portable display panel as claimed in claim 1, wherein the protrusion is a first protrusion, the first printed circuit board further including a second protrusion extending from a second side at the periphery of the first printed circuit board, the second side opposite the first side, the ground copper film exposed at an end of the second protrusion, wherein the exposed ground copper film at the end of the second protrusion is electrically connected to the bottom chassis and to a ground of the second printed circuit board.

4. The portable display panel as claimed in claim 1, wherein the protrusion is folded.

5. The portable display panel as claimed in claim 4, wherein the protrusion is folded at a predetermined angle.

6. The portable display panel as claimed in claim 1, further comprising a light emitting panel connected to the second printed circuit board.

7. The portable display panel as claimed in claim 6, wherein the light emitting panel is connected to the second printed circuit board on a side distal to the first printed circuit board.

8. The portable display panel as claimed in claim 1, wherein the liquid crystal display panel comprises:
   a first substrate;
   a second substrate facing the first substrate, the second substrate having a plurality of thin film transistors located thereon; and a liquid crystal layer injected between the first substrate and the second substrate.

9. The portable display panel as claimed in claim 1, wherein the light source comprises at least one light emitting diode.

10. The portable display panel as claimed in claim 1, further comprising a backlight assembly frame supporting the liquid crystal display panel and the backlight assembly, the backlight assembly frame having a first side fixed to the bottom chassis, and a second side opposite the first side.

11. The portable display panel as claimed in claim 10, further comprising a top chassis fixed to the second side of the backlight assembly frame.

12. The portable display panel as claimed in claim 1, wherein the protrusion has a protective film covering the ground copper film except at the end where the ground copper film is exposed.

13. A portable display panel comprising:
a liquid crystal display panel for displaying images;
a backlight assembly comprising a light source for supplying light to the liquid crystal display panel;
a bottom chassis for receiving the backlight assembly;
a first printed circuit board for controlling the liquid crystal display panel and the light source, the first printed circuit board including a ground copper film therein; and
a second printed circuit board electrically coupled to the first printed circuit board and an external drive circuit,
wherein the first printed circuit board has an integral bendable protrusion, the ground copper film exposed at an end of the protrusion, and a protective film covering the ground copper film except at the end of the protrusion where the ground copper film is exposed, and
wherein the protrusion is folded at an angle of approximately 180 degrees, the end of the protrusion being between a surface of the bottom chassis and a surface of the first printed circuit board facing the surface of the bottom chassis, and the exposed ground copper film at the end of the protrusion being electrically coupled to the bottom chassis.

14. The portable display panel as claimed in claim 13, wherein the protrusion produces a restoring force.

15. The portable display panel as claimed in claim 13, wherein the protrusion is a first protrusion, the portable display panel further comprising a second bendable protrusion having the ground copper film exposed at an end thereof, and wherein the first protrusion extends from a first side at a periphery of the first printed circuit board and the second protrusion extends from a second side at the periphery of the first printed circuit board, the second side opposite the first side.

16. The portable display panel as claimed in claim 15, wherein the ground copper film is electrically coupled to a ground of the second printed circuit board.

17. The portable display panel as claimed in claim 4, wherein the first printed circuit board has a surface facing the bottom chassis, the first side at the periphery of the printed circuit board is an edge of the surface facing the bottom chassis, and the exposed ground copper film at the end of the protrusion is substantially parallel to the surface facing the bottom chassis.

18. The portable display panel as claimed in claim 1, wherein the ground copper film of the first printed circuit board is connected directly to the bottom chassis without being connected through another material.

19. The portable display panel as claimed in claim 13, wherein the exposed ground copper film at the end of the protrusion is substantially parallel to the surface of the first printed circuit board facing the surface of the bottom chassis.

20. The portable display panel as claimed in claim 13, wherein the ground copper film of the first printed circuit board is connected directly to the bottom chassis without being connected through another material.

* * * * *